United States Patent [19]
Chow

[11] Patent Number: 5,409,186
[45] Date of Patent: Apr. 25, 1995

[54] UNITARY SEAT SUPPORT WITH INTEGRATED ELECTRONICS

[75] Inventor: Dominic Chow, Mukilteo, Wash.

[73] Assignee: ELDEC Corporation, Lynnwood, Wash.

[21] Appl. No.: 28,780

[22] Filed: Mar. 5, 1993

[51] Int. Cl.⁶ .............................................. B64D 11/06
[52] U.S. Cl. .............................. 244/122 R; 244/129.1; 297/217.3; 165/41; 361/707
[58] Field of Search ............. 244/118.1, 118.5, 122 R, 244/129.1; 361/707, 711, 831, 690–697; 297/217; 165/41, 47

[56] References Cited

U.S. PATENT DOCUMENTS

| | | | |
|---|---|---|---|
| 3,248,146 | 4/1966 | Cower, Jr. | 297/217 |
| 3,628,829 | 12/1971 | Heilig | 297/217 |
| 3,676,745 | 7/1972 | Traweek | 317/100 |
| 4,229,040 | 10/1980 | Howell et al. | 297/355 |
| 4,303,212 | 12/1981 | Stone et al. | 244/122 A |
| 4,358,173 | 11/1982 | Conrad | 339/17 CF |
| 4,375,300 | 3/1983 | Long et al. | 297/232 |
| 4,509,097 | 4/1985 | Robinson | 361/707 |
| 4,509,888 | 4/1985 | Sheek | 410/105 |
| 4,584,603 | 4/1986 | Harrison | 297/217 |
| 4,792,903 | 12/1988 | Peck et al. | 244/122 AE |
| 4,867,235 | 9/1989 | Graper et al. | 361/707 |
| 4,911,381 | 3/1990 | Cannon et al. | 244/122 R |
| 5,154,374 | 10/1992 | Beroth | 244/118.5 |
| 5,169,209 | 12/1992 | Beroth | 297/146 |
| 5,178,346 | 1/1993 | Beroth | 244/122 |

Primary Examiner—Galen L. Barefoot
Attorney, Agent, or Firm—Christensen, O'Connor, Johnson & Kindness

[57] ABSTRACT

An aircraft seat frame includes a plurality of upright seat supports each formed in one piece of heat-conductive material. Heat-generating electronics are thermally coupled to one of the supports. Such support acts as a heat sink to conduct and dissipate heat away from the electronics.

24 Claims, 9 Drawing Sheets

UNITARY SEAT SUPPORT WITH INTEGRATED ELECTRONICS

FIELD OF THE INVENTION

The present invention relates to the general field of aircraft seats. More specifically, the present invention relates to aircraft seats having electronic accessories incorporated in or mounted on the seats.

BACKGROUND OF THE INVENTION

In passenger aircraft there are competing considerations related to passenger seats and seat support structure. Foremost is passenger satiety in the event that high g forces are experienced. The seat must maintain its integrity at moderate g forces unlikely to result in passenger injury, but the situation is more complicated than simply providing a strong seat and support structure. At higher g forces, an unyielding seat is more likely to cause injury than a seat which will flex, bend or collapse in a controlled manner. The situation is further complicated by the fact that sudden breaking of a seat support can result in a dangerous rapid increase in g forces, in addition to increasing the likelihood of puncture injury to passengers or the aircraft by the broken support pieces. Therefore, modern government regulations provide limits within which seat supports must not permanently yield (i.e., moderate g forces) and higher limits within which the seat supports can yield but not fail.

Other important considerations are space and weight. Passenger seats and seat frames must be both compact and light. For example, the space under the seat must be as open as possible in order to accommodate the feet and lower legs of passengers of the next row and, traditionally, carry-on luggage. As a result, conventional seat frames have narrow upright support members. Early versions of such frames used a plurality of tubular members connected by braces and brackets. Newer seat frames have one-piece upright supports machined or cast of solid metal with carefully positioned voids and areas of reduced thickness to decrease weight while maintaining adequate strength and performance over the required range of g forces.

Another consideration in aircraft passenger seating has been passenger comfort which, recently, has been considered to be related to passenger entertainment. It now has been proposed that more interactive electronic systems be provided for individual passengers. Sophistication of electronics proposed for each seat continues to increase. Such electronics require control systems and power supplies that generate heat. In standard seat constructions there is no convenient location for an additional, sometimes fragile, unit which may become hot. Space is at such a premium that almost any additional unit of any substantial size will be exposed or adjacent to a passenger. Heat-generating components have been encased in housings mounted on the seat support structure at vulnerable locations. The housings have been insulated to avoid inconveniencing the nearest passengers. Power consumption must necessarily be low to avoid heat buildup within the housings that could damage the electronics. Low power consumption also is required in order to avoid uncomfortable hot spots close to passengers. Routing of wires to and from such units also has been a problem.

SUMMARY OF THE INVENTION

The present invention provides a unitary seat support modified for integrating heat-generating electronics into the support. Rather than thermally isolating the heat-generating components from the support, in the present invention the heat-generating components are in direct thermal contact with the support. The support itself acts as a heat sink to conduct and dissipate heat away from the electronics. Preferably the electronics are fitted in a cavity of the unitary seat support. The cavity can be closed by a cover plate to protect the electronics while maximizing the available space adjacent to the support.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
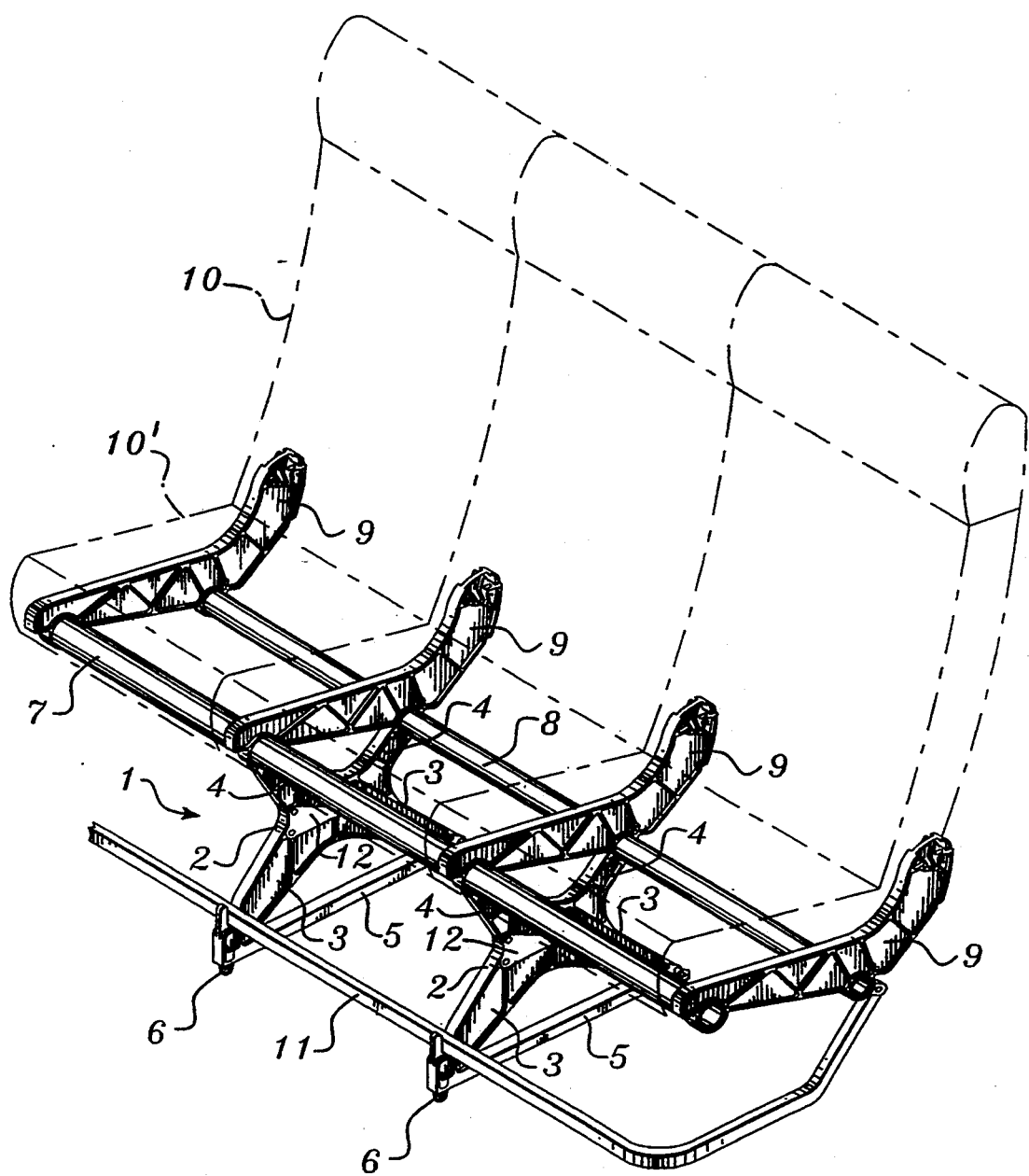
FIG. 1 is a somewhat diagrammatic top perspective of a known aircraft seat frame.

FIG. 1 illustrates a conventional seat assembly of the type with which the present invention is concerned. The supporting seat frame 1 includes two upright unitary supports 2 each having a main body of generally X configuration. Such body includes downward diverging support members or legs 3 and upward diverging arms 4. The downward diverging legs are connected at the bottom by an integral base member or stringer 5. The stringer carries conventional track fasteners 6 by which the support member can be secured in a cooperating channel (not shown) of the deck or floor of an aircraft passenger compartment.

The upper ends of the support arms 4 have concave sockets for supporting a front cross tube 7 and a rear cross tube 8. Structural arms 9 are carried by and bridge between the cross tubes. The conventional aircraft seat assembly 10 is supported on the structural frame 1, including the generally horizontal seat portion 10'. A nonstructural rail 11 can extend along the exposed side and front of the frame to retain and protect articles stowed under the seats.

In the known construction, each support 2 is of one-piece construction, cast or machined of a light but strong metal such as aircraft grade aluminum alloy, with an open space above, below, behind and in front of the central portion of the body. The entire support is designed to withstand moderate g forces without permanent damage. At higher g forces, the support will bend or collapse without breaking. An important area is the junction of the front support arm 4 with the front support leg 3 since the forces of most concern are directed forward and downward. That area can include structural plates 12 designed to achieve the desired shock-absorbing action of the support and the frame of which it is a part.

Figure 2:
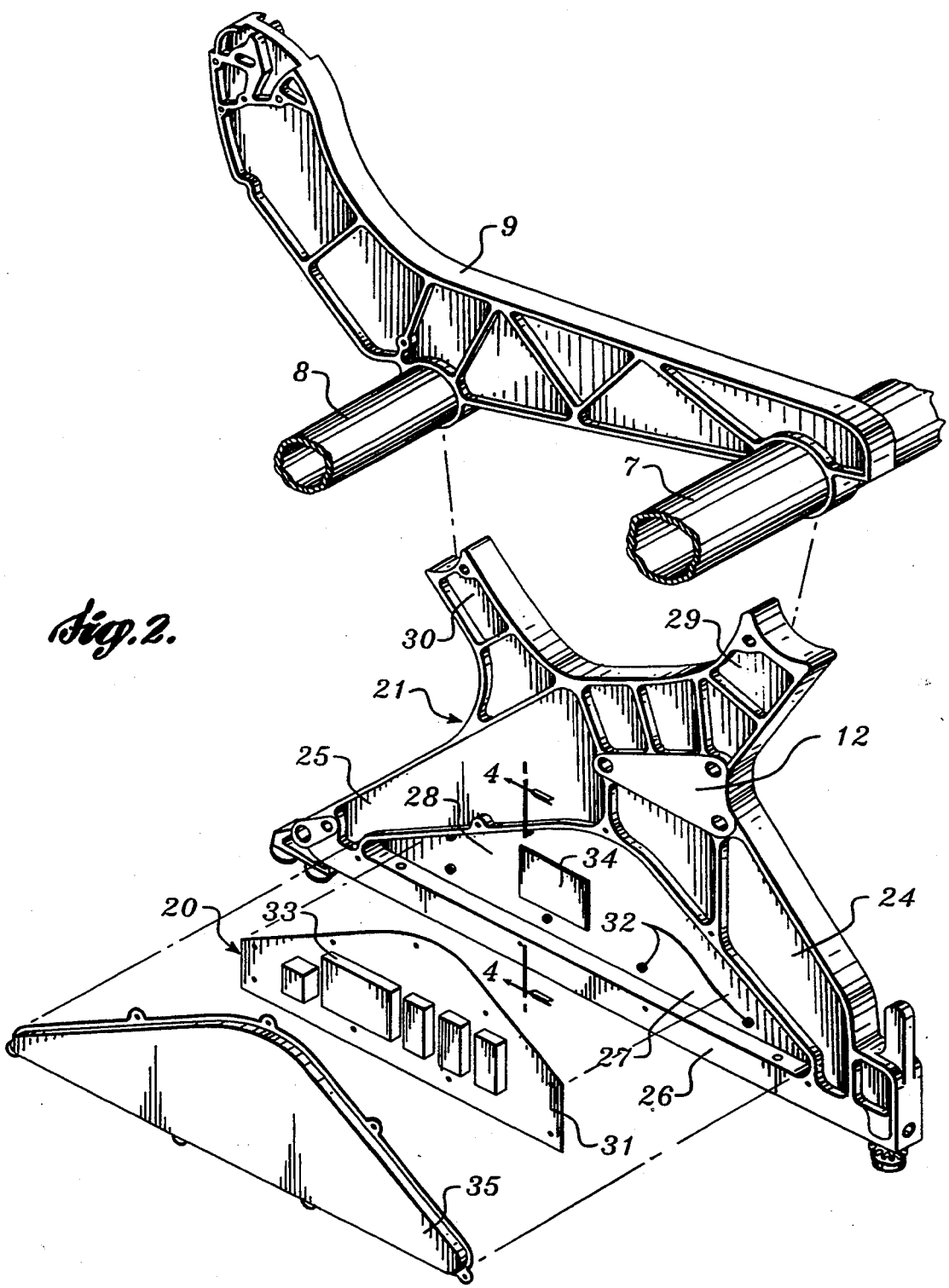
FIG. 2 is a top, left perspective of a unitary seat support with integrated electronics in accordance with the present invention, parts being shown in exploded relationship.
Figure 3:
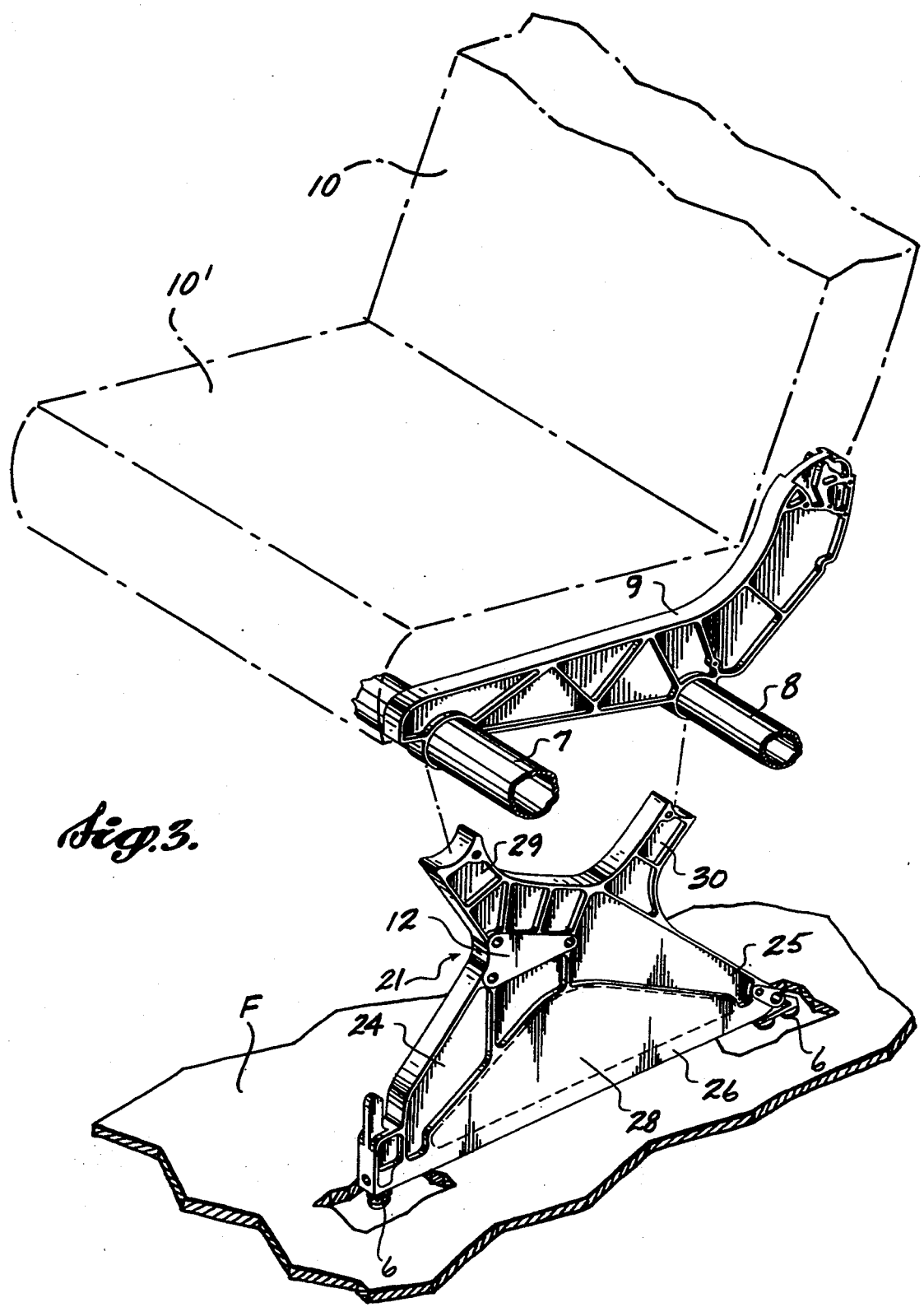
FIG. 3 is a top, right perspective of the seat support of FIG. 2.
Figure 4:
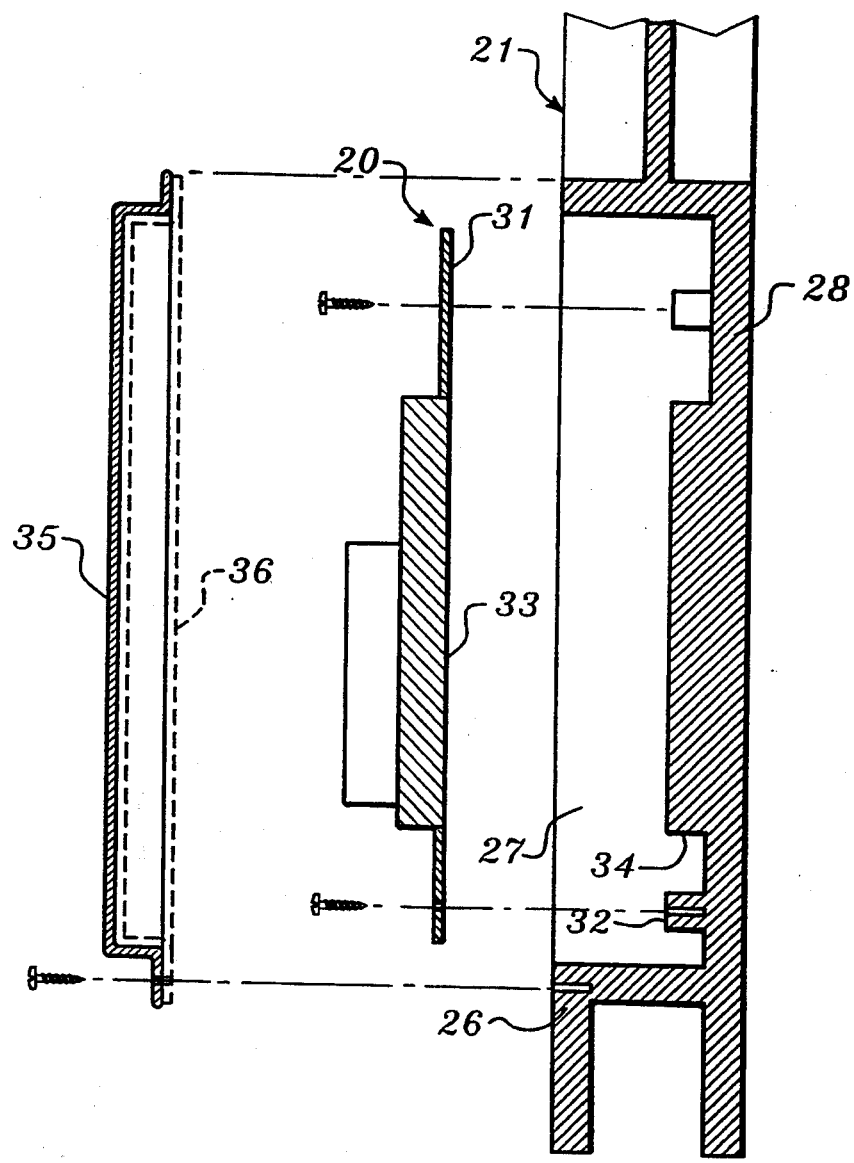
FIG. 4 is an enlarged vertical section along line 4—4 of FIG. 2.

With reference to FIGS. 2 through 4, in accordance with the present invention a heat-producing electronic unit or module 20 is integrated with the upright seat support 21 which preferably is substantially identical to the known support previously described, except that the opening between the front leg 24, rear leg 25 and bottom stringer 26 is closed at one side to form a cavity 27 opening at the other side of the support, at a location underlying the horizontal portion 10' of the seat assembly 10. As best seen in FIG. 4, preferably the closed side 28 of the cavity is formed integrally with the remainder of the support. In other respects, the support 21 has the same features as the known support previously described, including upward and outward diverging members or arms 29 and 30 for supporting the cross tubes 7; 8 and the shock-absorbing junction of the front arm 29 and the lower front member or leg 24 which can include the shock-absorbing plate 12, and the fasteners 6 which secure the support to the floor F.

The electronic module or unit 20 can include a wiring or circuit board 31 for the various electronic components desired. Wiring board 31 can be secured in the cavity 27 by conventional fasteners received in raised studs 32. However, preferably there is direct thermal contact between the base or sidewall 28 of the cavity and at least the electronic component generating the most heat, represented as component 33 in FIGS. 2 and 4. Such component typically would be the power supply or power converter.

Figure 5:
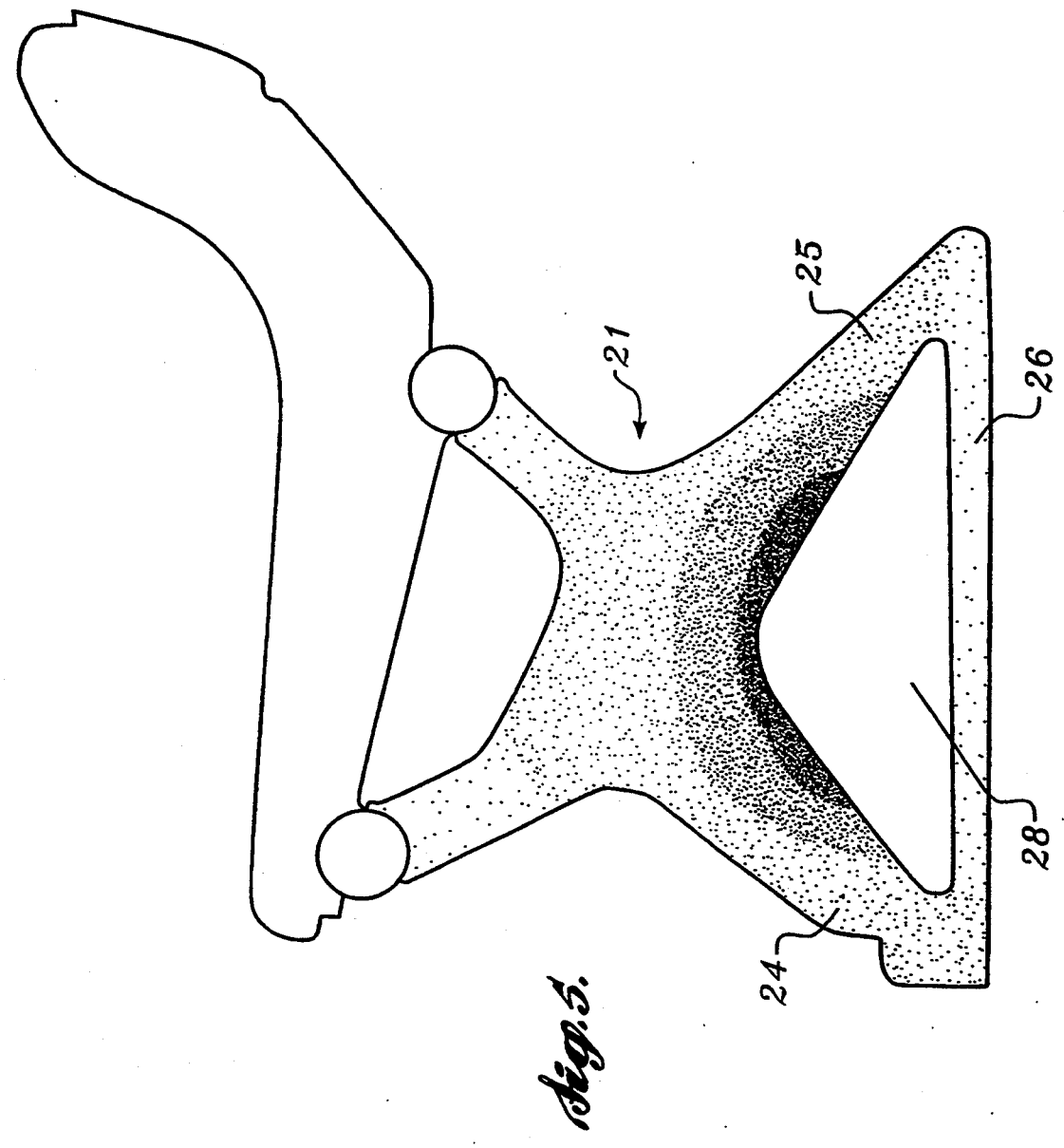
FIG. 5 is a diagrammatic right side elevation of the seat support of FIG. 2 shaded to illustrate heat conduction through the support.

As best seen in FIG. 4, the heat-generating component 33 can extend through a cutout of the wiring board 31 so as to engage against a raised pedestal 34 of the sidewall 28. Other than the substantially contiguous engagement between such pedestal 34 and component 33, there is no mechanical interface between the heat-generating component or module and other parts of the unitary support 21 to inhibit heat conduction through the support. Consequently, the entire support acts as a heat sink to conduct heat away from the electronics and dissipate the heat to the surrounding atmosphere. For example, the diagrammatic side elevation of FIG. 5 is stipled to represent the heat dissipation if the heat-generating component is mounted high in the cavity. Denser stipling indicates higher temperature. Heat generated by the electronic unit radiates outward along the support and is dissipated into the surrounding atmosphere over the large surface area of the support.

Returning to FIG. 4, the heat-generating component 33 could be arranged to engage sidewall 28 of cavity 27 without a raised pedestal 34. However, by providing such a raised pedestal the major portion of the circuit board 31 is spaced from the wall, thereby allowing room for wiring or pin connectors or other electronic components between the board and the wall. Cables or wiring harnesses for the electronics can be routed through the bottom stringer 26.

To protect the electronic module 20, a cover plate 35 can be used to close the open side of the cavity 27. Such cover plate can be either heat-insulative or heat-conductive material. If a heat-conductive cover plate is used, it can have a layer 36 of insulation. Otherwise the cover plate could develop an uncomfortable hot spot along the open side of the support if the cover plate is close alongside the heat-generating component. Similarly, an insulating layer or cover can be provided on the opposite side of the support in the area of the heat-generating component.

As compared to known enclosed electronic modules currently in use which may provide a few watts of power, by integrating the electronics with a unitary seat support in accordance with the present invention a unit having a much higher power output can be used, thereby allowing a greater selection of electronics that can be incorporated in passenger seating.

Figure 6:
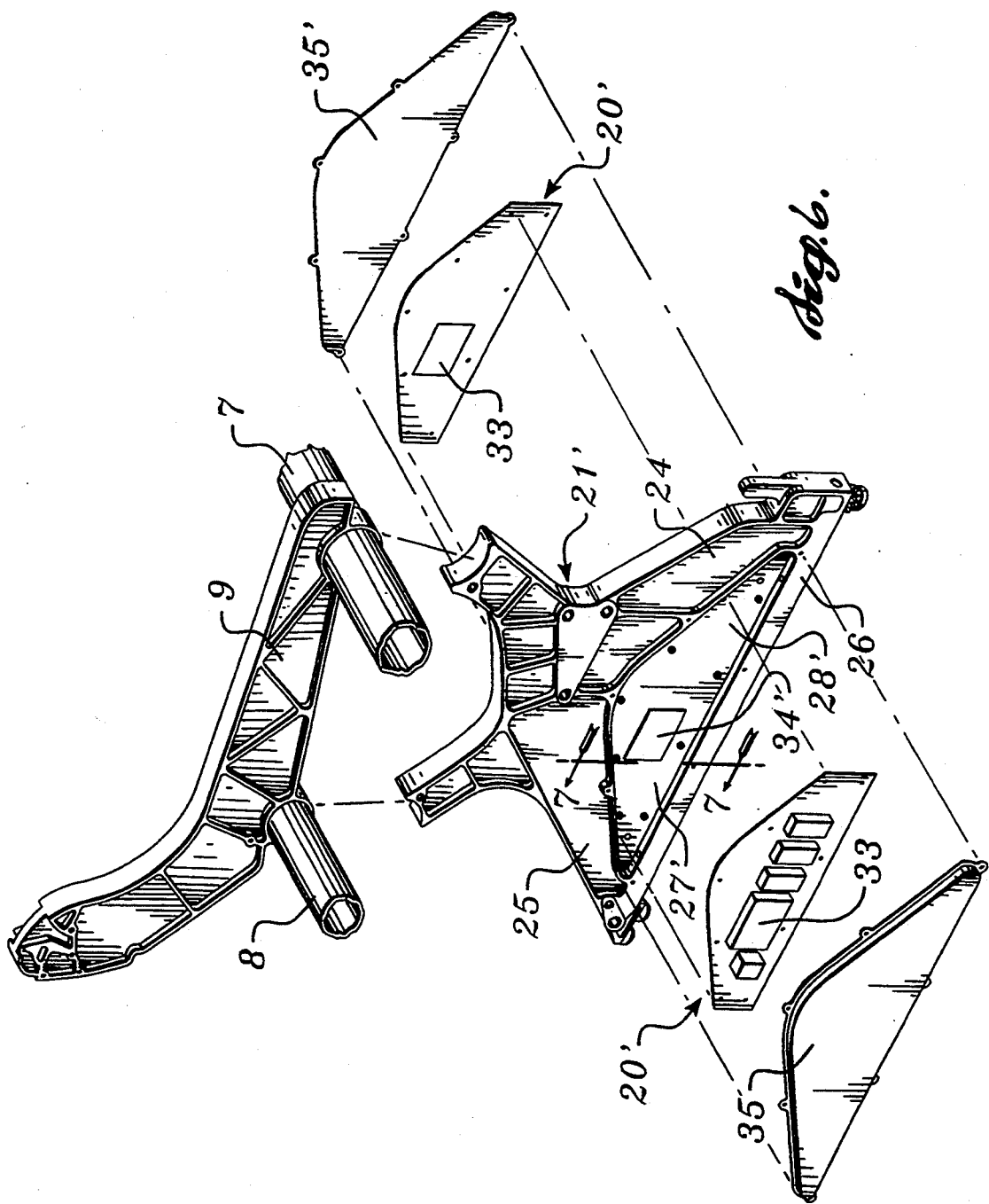
FIG. 6 is a top left perspective of a modified unitary seat support with integrated electronics in accordance with the present invention, parts being shown in exploded relationship.
Figure 7:
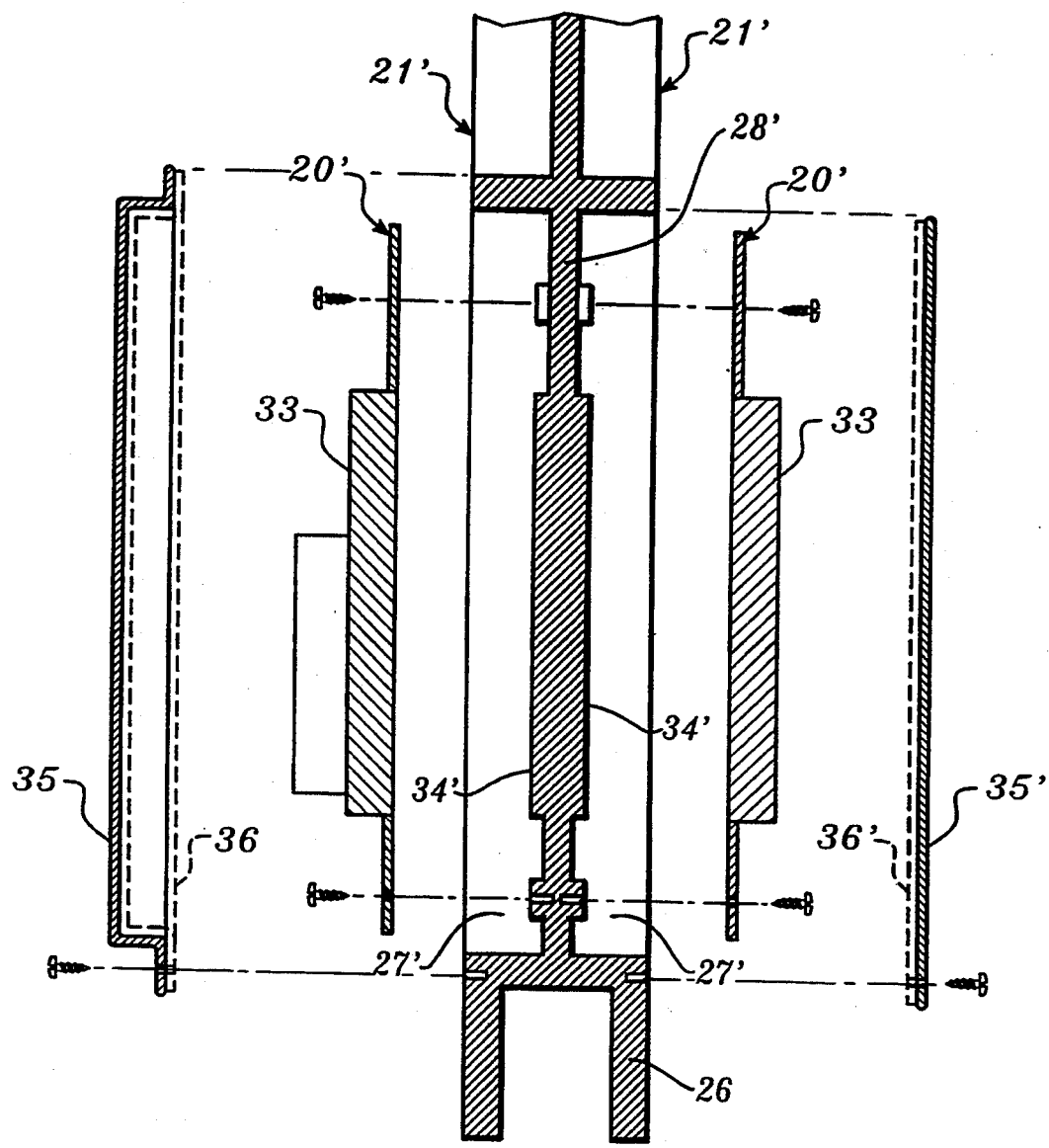
FIG. 7 is a somewhat diagrammatic vertical section along line 7—7 of FIG. 6.

In the modified form of the invention shown in FIGS. 6 and 7, the space between the front leg 24, rear leg 25, and bottom stringer 26 is closed by a vertical plate 28' that extends centrally of the modified support 21' as best seen in FIG. 7. Consequently, outward opening cavities 27' are formed in the opposite sides of the support. Electronic modules 20' can be mounted in either or both of the cavities. Preferably the heat-generating component 33 will directly engage the vertical plate 28' for direct thermal conduction. For example, pedestal portions 34' can be formed at opposite sides of the central plate. Cavities 27' can be closed by cover plates 35 and 35' which can have an inner layer of insulation 36 or 36' (FIG. 7). Depending on the height of the electronic components, the cover plate can be dished, such as the plate 35 shown at the left of FIG. 7, or it can be a flat plate, such as plate 35' shown at the right of FIG. 7.

In other respects the embodiment of FIGS. 6 and 7 is identical to the embodiment of FIGS. 2 through 4. The entire support 21' acts as a heat sink to conduct and dissipate heat generated by the electronic component 33.

Figure 8:
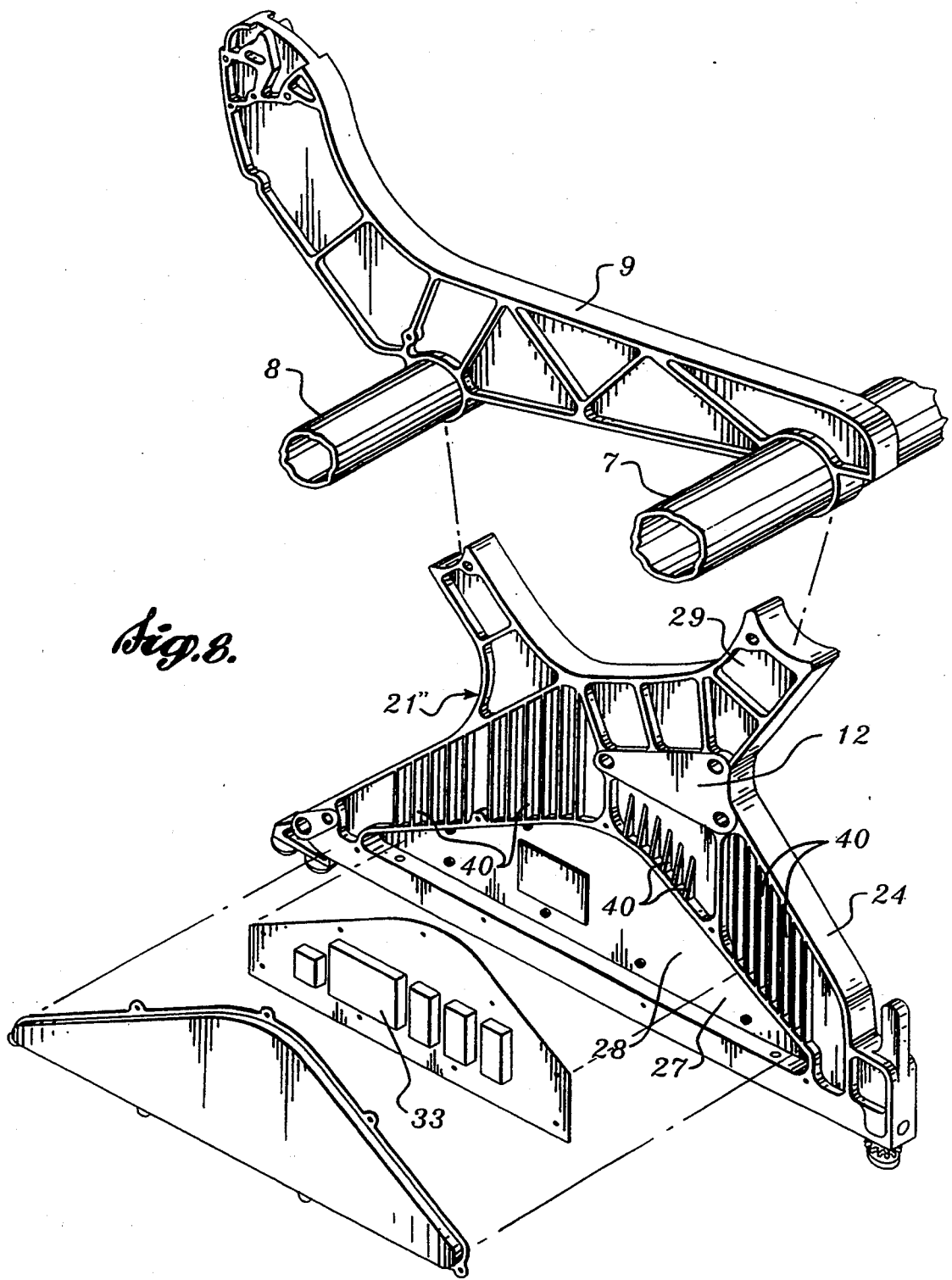
FIG. 8 is a top left perspective of another embodiment of a unitary seat support with integrated electronics in accordance with the present invention, parts being shown in exploded relationship.

In the embodiment shown in FIG. 8, the support 21" has been provided with integral ribs or fins 40 extending from the upper rim of the cavity 27 toward the next closest structural rib of the support. Such fins increase the exposed surface area of the support for a greater dissipation of heat conducted from the heat-generating component 33 through the sidewall 28. In other respects the embodiment of FIG. 8 is identical to the embodiment of FIGS. 2 through 4.

However, the addition of integral fins such as shown in FIG. 8 may affect the shock-absorbing performance of the support. Modifications may be required in the area of the junction of the front leg and front arm such as by incorporating a plate 12 having a different flex or bending characteristic.

Figure 9:
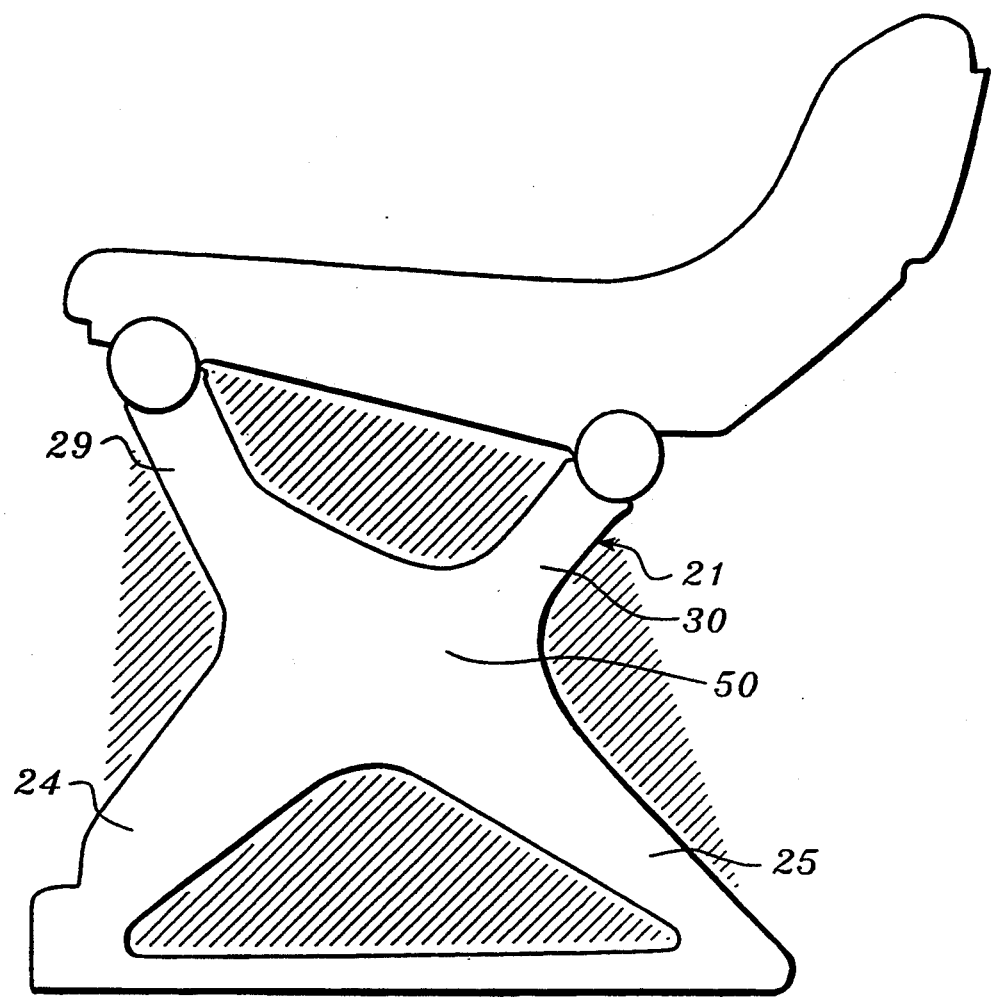
FIG. 9 is a diagrammatic right side elevation of a unitary seat support shaded to illustrate alternative locations for integration of electronics.

Similarly, as represented by the shading in FIG. 9, the integral plate on which the electronics are mounted could be formed in the recess at the front, back or top of the support 21, as well as in the opening at the bottom; and small electronic modules can be mounted in cavities in a leg 24 or 25, an arm 29 or 30, the central portion 50 of the support or the upper structural member 9. By forming the electronic cavity in the bottom of the support, however, fewer design changes are required to the known support in order to achieve the desired strength and performance of the support.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. Seat support structure comprising an upright seat support of heat conductive material including forward and rear seat support members, and a heat-generating electronics unit mounted to said seat support and positioned between said forward and rear seat support members, said unit being thermally coupled to said seat support so that heat is conducted from said unit through said support and is dissipated from said support.

2. The structure defined in claim 1, in which the support has opposite upright sides and a cavity opening through one of said sides, the electronics unit being mounted in said cavity.

3. The structure defined in claim 2, including a cover plate closing the open side of the cavity.

4. The structure defined in claim 2, in which the cavity includes a base portion having a raised pedestal, the electronics unit being mounted in direct thermal contact with said pedestal.

5. The structure defined in claim 1, in which the electronics unit is mounted on a plate of heat-conductive material extending from at least one of the forward and rear seat support members and thermally coupled thereto.

6. The structure defined in claim 1, in which the electronics unit is mounted on a plate of heat-conductive material extending between and thermally coupled to the forward and rear seat support members.

7. The structure defined in claim 1, including a seat assembly supported over the forward and rear seat support members, said assembly having forward and rear portions, the forward and rear seat support members being located, respectively, toward the front and rear portions of said seat assembly and being relatively spaced apart, and the electronics unit underlying the seat assembly.

8. The structure defined in claim 1, including a seat assembly having a generally horizontal portion supported over the support, and means mounting the electronics unit at a location underlying said horizontal portion of said seat assembly.

9. The structure defined in claim 1, including a floor below the support, and means for securing the seat support to said floor.

10. The structure defined in claim 9, in which the floor has a channel, the securing means being cooperable with said channel for substantially stationarily securing the support to the floor.

11. Seat support structure comprising an upright seat support of heat conductive material, and a heat-generating electronics unit thermally coupled to said support for conduction of heat from said unit through said support and for dissipation of heat from said support, said upright seat support being of generally X configuration including downward diverging legs and upward diverging arms forming recesses toward the top, front, back and bottom of said support between said arms and legs, said support including a vertical plate of heat-conductive material integral with said arms and legs and extending across one of said recesses, said electronics unit being mounted on said plate.

12. The structure defined in claim 11, in which the plate extends between the downward diverging legs of the support.

13. The structure defined in claim 12, in which the seat support has opposite upright sides, the plate being substantially aligned with one of said sides and forming a cavity opening at the other of said sides, the electronics unit being mounted in said cavity.

14. The structure defined in claim 11, in which the seat support includes heat-radiating fins extending from the cavity.

15. The structure defined in claim 11, in which the plate is disposed substantially centrally between the opposite upright sides of the seat support so as to form cavities opening oppositely at such sides, and the electronics unit being mounted in one of said cavities in thermal contact with the plate.

16. An aircraft seat frame for supporting a seat assembly comprising a plurality of upright unitary seat supports of heat-conductive material, and a heat-generating electronic module mounted in direct thermal contact with one of said supports for conducting heat therethrough and dissipating heat therefrom, wherein said module is positioned between a first and a second of said supports.

17. The frame defined in claim 16, in which the support has a cavity, the heat-generating unit being mounted in said cavity.

18. A unitary seat support with integrated electronics comprising an upright structural body of heat-conductive material of generally X configuration including a central portion, front and rear legs diverging downward from said central portion and front and rear arms diverging upward from said central portion, and a stringer extending between and connecting the lower end portions of said downward diverging legs, an upright plate formed integrally with and bridging between said legs, and a heat-generating electronics unit mounted on said plate and thermally coupled thereto for conduction of heat through said plate to said legs and the remainder of said support for dissipation of heat from the support.

19. The method of dissipating heat from a heat-generating electronics unit of aircraft seat electronics which comprises mounting the heat-generating unit on a unitary upright seat support of heat-conductive material and positioning the heat-generating unit between front and rear upright portions of said seat support, for conducting heat through the support and for dissipating heat from the support.

20. The method defined in claim 19, including mounting the heat-generating unit in a cavity of the support.

21. The method defined in claim 20, including enclosing the electronic unit in the cavity by securing a cover plate over the cavity.

22. Seat structure for supporting a generally horizontal seat spaced above a floor comprising two upright seat support members, at least one of said members being heat-conductive material, and a heat-generating electronics unit thermally coupled to said at least one support member at a location between said two support members and positioned between said two support members for conduction of heat from said unit through said at least one support member and for dissipation of heat from said at least one support member.

23. The structure defined in claim 22, in which the electronics unit underlies the seat.

24. Seat support structure comprising an upright seat support of heat conductive material, and a heat-generating electronics unit thermally coupled to said support for conduction of heat from said unit through said support and for dissipation of heat from said support, said upright seat support being of generally X configuration including downward diverging legs and upward diverging arms forming recesses toward the top, front, back and bottom of said support between said arms and legs, said support including a vertical plate of heat conductive material thermally coupled to said arms and legs and extending across one of said recesses, said electronics unit being mounted on said plate.

* * * * *

UNITED STATES PATENT AND TRADEMARK OFFICE
CERTIFICATE OF CORRECTION

PATENT NO. : 5,409,186
DATED : April 25, 1995
INVENTOR(S) : Dominic Chow

It is certified that error appears in the above-indentified patent and that said Letters Patent is hereby corrected as shown below:

| COLUMN | LINE | |
|---|---|---|
| 1 | 15 | "satiety" should read --safety-- |
| 2 | 57-58 | "diverging arms 4." should read --diverging support members or arms 4.-- |

Signed and Sealed this

Twenty-second Day of August, 1995

Attest:

BRUCE LEHMAN

Attesting Officer     Commissioner of Patents and Trademarks